United States Patent
Su et al.

(10) Patent No.: US 10,475,906 B2
(45) Date of Patent: Nov. 12, 2019

(54) FABRICATION METHOD OF THIN FILM TRANSISTOR, FABRICATION METHOD OF ARRAY SUBSTRATE, DISPLAY PANEL, AND DISPLAY DEVICE

(71) Applicant: BOE TECHNOLOGY GROUP CO., LTD., Beijing (CN)

(72) Inventors: Tongshang Su, Beijing (CN); Shengping Du, Beijing (CN); Ning Liu, Beijing (CN); Dongfang Wang, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 7 days.

(21) Appl. No.: 15/512,981
(22) PCT Filed: Sep. 6, 2016
(86) PCT No.: PCT/CN2016/098168
§ 371 (c)(1),
(2) Date: Mar. 21, 2017
(87) PCT Pub. No.: WO2017/071405
PCT Pub. Date: May 4, 2017

(65) Prior Publication Data
US 2017/0301777 A1    Oct. 19, 2017

(30) Foreign Application Priority Data

Oct. 29, 2015  (CN) .......................... 2015 1 0718317

(51) Int. Cl.
*H01L 29/66* (2006.01)
*H01L 27/12* (2006.01)
*H01L 29/786* (2006.01)

(52) U.S. Cl.
CPC .... *H01L 29/66969* (2013.01); *H01L 27/1288* (2013.01); *H01L 29/7869* (2013.01)

(58) Field of Classification Search
CPC ............... H01L 27/3244; H01L 29/786; H01L 29/66742; H01L 29/66969;
(Continued)

(56) References Cited

U.S. PATENT DOCUMENTS 5,130,263 A     7/1992  Possin et al.
2008/0265442 A1  10/2008  Yagi
(Continued)

FOREIGN PATENT DOCUMENTS

CN     101013709 A       8/2007
CN     101047145 A   *  10/2007
(Continued)

OTHER PUBLICATIONS

Search Report and Written Opinion dated Dec. 12, 2016 from State Intellectual Property China of the P.R. China.
(Continued)

*Primary Examiner* — Mohammed R Alam
(74) *Attorney, Agent, or Firm* — Dilworth & Barrese, LLP.; Michael J. Musella, Esq.

(57) ABSTRACT

A fabrication method of a thin film transistor, a fabrication method of an array substrate, a display panel, and a display device are provided. The fabrication method of the thin film transistor comprises: forming a gate electrode, a gate insulating layer and an oxide active layer; forming an inverted trapezoidal dissolution layer whose cross section is inverted trapezoidal on the oxide active layer, the inverted trapezoidal dissolution layer being soluble in an organic solvent; forming a source/drain layer on the oxide active layer, the gate insulating layer and the inverted trapezoidal dissolution layer, a thickness of the inverted trapezoidal dissolution layer being greater than a thickness of the source/drain layer; and dissolving and removing the inverted trapezoidal dissolution layer with the organic solvent and removing the source/drain layer on the inverted trapezoidal dissolution layer, to form a source electrode and a drain electrode.

13 Claims, 16 Drawing Sheets

(58) Field of Classification Search
CPC ........... H01L 29/78618; H01L 29/7869; H01L 27/32; H01L 27/3262; H01L 27/3265; H01L 27/1214; H01L 27/1288; H01L 23/4824; H01L 27/1225; H01L 29/4908; H01L 2924/0002; H01L 2924/12044; G02F 1/1333; G02F 2001/136231
See application file for complete search history.

(56) References Cited

U.S. PATENT DOCUMENTS

| | | |
|---|---|---|
| 2011/0012198 A1 | 1/2011 | Yagi |
| 2011/0101358 A1 | 5/2011 | Nomoto et al. |
| 2013/0215370 A1* | 8/2013 | Takanishi ............ H01L 27/1225 349/139 |
| 2014/0322850 A1 | 10/2014 | Lee et al. |
| 2015/0270290 A1 | 9/2015 | Wei et al. |

FOREIGN PATENT DOCUMENTS

| | | | |
|---|---|---|---|
| CN | 101689510 A | | 3/2010 |
| CN | 104319293 A | * | 1/2015 |
| CN | 105206678 A | | 12/2015 |
| JP | 2215134 | | 8/1990 |
| WO | 2014146291 A1 | | 9/2014 |

OTHER PUBLICATIONS

Chinese Office Action dated Sep. 1, 2017.
Supplemental Partial European Search Report dated May 2, 2019.

\* cited by examiner

FABRICATION METHOD OF THIN FILM TRANSISTOR, FABRICATION METHOD OF ARRAY SUBSTRATE, DISPLAY PANEL, AND DISPLAY DEVICE

TECHNICAL FIELD

Embodiments of the present disclosure relate to a fabrication method of a thin film transistor, a fabrication method of an array substrate, a display panel, and a display device.

BACKGROUND

An oxide thin film transistor (TFT) array substrate includes a TFT array substrate of a back channel etching type, a TFT array substrate of a coplanar type, a TFT array substrate of an etching barrier type, and so on. The TFT array substrate of the back channel etching type and the TFT array substrate of the coplanar type are widely used because of their simple structures.

The TFT array substrate of the back channel etching type has a structure in which a gate electrode, a gate insulating layer, an oxide active layer, a source electrode, a drain electrode, a passivation layer, and a pixel electrode are sequentially formed on a base substrate. During forming the source electrode and the drain electrode, a source/drain layer is firstly deposited on the oxide active layer, and then the source electrode and the drain electrode are formed by a single patterning process.

The TFT array substrate of the coplanar type has a structure in which the gate electrode, the gate insulating layer, the source electrode, the drain electrode, the oxide active layer, the passivation layer and the pixel electrode are sequentially formed on the base substrate. During forming the oxide active layer, a metal oxide layer is firstly deposited on the source electrode, the gate insulating layer and the drain electrode, and the oxide active layer is formed by a single patterning process.

SUMMARY

According to embodiments of the disclosure, a fabrication method of a thin film transistor is provided. The method comprises: forming a gate electrode, a gate insulating layer and an oxide active layer of the thin film transistor by patterning processes, the gate insulating layer being located between the gate electrode and the oxide active layer; forming an inverted trapezoidal dissolution layer whose cross section is inverted trapezoidal on the oxide active layer, the inverted trapezoidal dissolution layer being soluble in an organic solvent; forming a source/drain layer on the oxide active layer, the gate insulating layer and the inverted trapezoidal dissolution layer, a thickness of the inverted trapezoidal dissolution layer being greater than a thickness of the source/drain layer; and dissolving and removing the inverted trapezoidal dissolution layer with the organic solvent and removing the source/drain layer on the inverted trapezoidal dissolution layer, to form a source electrode and a drain electrode.

For example, the source/drain layer formed on the inverted trapezoidal dissolution layer is disconnected from the source/drain layer formed on other portions except the inverted trapezoidal dissolution layer.

For example, the forming the inverted trapezoidal dissolution layer on the oxide active layer, includes: forming a dissolution layer on the oxide active layer; performing a mask exposure on the dissolution layer within a first region so that the dissolution layer within the first region generates an acidic substance, the acidic substance being capable of enhancing a crosslinking reaction, and the first region being located on the oxide active layer; performing reverse-drying, extensive exposure and development processes on the dissolution layer, so as to remove the dissolution layer in other regions except the first region and to change the dissolution layer within the first region into the inverted trapezoidal dissolution layer.

For example, during the mask exposure process, a portion of the dissolution layer within the first region which is farther away from the oxide active layer is subjected to stronger intensity of exposure, so that the portion of the dissolution layer within the first region which is farther away from the oxide active layer generates more acidic substance.

For example, the performing reverse-drying, extensive exposure and development processes on the dissolution layer, so as to remove the dissolution layer in other regions except the first region and to change the dissolution layer within the first region into the inverted trapezoidal dissolution layer, includes: performing the reverse-drying on the thin film transistor, the dissolution layer undergoing the crosslinking reaction in the reverse-drying process, a degree of the crosslinking reaction of the dissolution layer within the first region under action of the acidic substance being stronger than that of the dissolution layer in other regions, and molecular density and hardness of dissolution layer within the first region being both higher than those of the dissolution layer in other regions after the reverse-drying process; performing the extensive exposure on the reverse-dried thin film transistor, the dissolution layer in other regions having its molecular chain broken during the extensive exposure process; performing the developing process on the extensive-exposed dissolution layer, so that the dissolution layer within the first region becomes the inverted trapezoidal dissolution layer and the dissolution layer in other regions is dissolved in a developer.

For example, in the reverse-drying process, and under action of the acidic substance in the solution layer within the first region, the portion of the dissolution layer within the first region which is farther away from the oxide active layer undergoes more intensive crosslinking reaction, resulting in higher molecular density and hardness of the portion of the dissolution layer within the first region which is farther away from the oxide active layer; in the extensive exposure process, the portion of the dissolution layer within the first region which has a lower molecular density and hardness is more apt to have a molecular chain broken, so that the portion of the dissolution layer within the first region which is farther away from the oxide active layer has fewer molecules with the molecular chain broken; in the developing process, the portion of the dissolution layer within the first region having fewer molecules with the molecular chain broken is more difficult to dissolve in the developer, so that it is more difficult for the portion of the dissolution layer within the first region which is farther away from the oxide active layer to dissolve in the developer.

For example, before the performing the mask exposure on the dissolution layer within the first region, the method further comprises: prebaking the dissolution layer, to remove a solvent in the dissolution layer.

According to the embodiments of the disclosure, a fabrication method of an array substrate is provided. The method comprises: forming a gate electrode and a gate line, a gate insulating layer and an oxide active layer on a base substrate, the gate insulating layer being located between the gate electrode and the oxide active layer; forming an inverted trapezoidal dissolution layer whose cross section is inverted trapezoidal on the oxide active layer, the inverted trapezoidal dissolution layer being soluble in an organic solvent; forming a source/drain layer on the oxide active layer, the gate insulating layer and the inverted trapezoidal dissolution layer, a thickness of the inverted trapezoidal dissolution layer being greater than a thickness of the source/drain layer; dissolving and removing the inverted trapezoidal dissolution layer with the organic solvent and removing the source/drain layer on the inverted trapezoidal dissolution layer, to form a source electrode, a data line and a drain electrode; forming a passivation layer on the source electrode, the oxide active layer and the drain electrode; and forming a pixel electrode on the passivation layer.

For example, the forming the inverted trapezoidal dissolution layer on the oxide active layer, includes: forming a dissolution layer on the oxide active layer; performing a mask exposure on the dissolution layer within a first region, so that the dissolution layer within the first region generates an acidic substance, the acidic substance being capable of enhancing a crosslinking reaction, and the first region being located on the oxide active layer; performing reverse-drying, extensive exposure and development processes on the dissolution layer, so as to remove the dissolution layer in other regions except the first region and to change the dissolution layer within the first region into the inverted trapezoidal dissolution layer.

According to the embodiments of the disclosure, a display panel is provided. The display panel comprises the array substrate formed by the method as described above.

According to the embodiments of the disclosure, a display device is provided. The display device comprises the display panel as described above.

According to the embodiments of the disclosure, a fabrication method of a thin film transistor is provided. The method comprises: forming a gate electrode, a gate insulating layer, a source electrode and a drain electrode of the thin film transistor by patterning processes, the source electrode and the drain electrode being located in a same layer, and the gate insulating layer being located between the source electrode as well as the drain electrode and the gate electrode; forming an inverted trapezoidal dissolution layer whose cross section is inverted trapezoidal on the source electrode and the drain electrode, the inverted trapezoidal dissolution layer being soluble in an organic solvent; forming a metal oxide active layer on the source electrode, the drain electrode, the gate insulating layer and the inverted trapezoidal dissolution layer, a thickness of the inverted trapezoidal dissolution layer being greater than a thickness of the metal oxide active layer; and dissolving and removing the inverted trapezoidal dissolution layer and the metal oxide active layer on the inverted trapezoidal dissolution layer with the organic solvent, to form an oxide active layer.

For example, the metal oxide active layer formed on the inverted trapezoidal dissolution layer is disconnected from the metal oxide active layer formed on other portions except the inverted trapezoidal dissolution layer.

For example, the forming the inverted trapezoidal dissolution layer on the source electrode and the drain electrode, includes: forming a dissolution layer on the source electrode and the drain electrode; performing a mask exposure on the dissolution layer within a second region and a third region so that the dissolution layer within the second region and the third region generates an acidic substance, the acidic substance being capable of enhancing a crosslinking reaction, the second region being located on the source electrode, and the third region being located on the drain electrode; performing reverse-drying, extensive exposure and development processes on the dissolution layer, to remove the dissolution layer in other regions except the second region and the third region and to change the dissolution layer within the second region and the third region into an inverted trapezoidal dissolution layer.

For example, during the mask exposure process, a portion of the dissolution layer within the second region which is farther away from the source electrode is subjected to stronger intensity of exposure so that the portion of the dissolution layer within the second region which is farther away from the source electrode generates more acidic substance, and a portion of the dissolution layer within the third region which is farther away from the drain electrode is subjected to stronger intensity of exposure so that the portion of the dissolution layer within the third region which is farther away from the drain electrode generates more acidic substance.

For example, the performing reverse-drying, extensive exposure and development processes on the dissolution layer to remove the dissolution layer in other regions except the second region and the third region and to change the dissolution layer within the second region and the third region into the inverted trapezoidal dissolution layer, includes: performing the reverse-drying on the thin film transistor, the dissolution layer undergoing the crosslinking reaction in the reverse-drying process, a degree of the crosslinking reaction of the dissolution layer within the second region and the third region under action of the acidic substance being stronger than that of dissolution layer in other regions, and molecular density and hardness of the dissolution layer within the second region and the third region being both higher than those of the dissolution layer in other regions after the reverse-drying process; performing the extensive exposure on the reverse-dried thin film transistor, the dissolution layer in other regions having its molecular chain broken during the extensive exposure process; performing the developing process on the extensive-exposed dissolution layer, so that the dissolution layer within the second region and the third region becomes the inverted trapezoidal dissolution layer and the dissolution layer in other regions is dissolved in a developer.

For example, in the reverse-drying process, under action of the acidic substance in the dissolution layer within the second region and the third region, the portion of the dissolution layer within the second region which is farther away from the source electrode undergoes more intensive crosslinking reaction, resulting in higher molecular density and hardness of the portion of the dissolution layer within the second region which is farther away from the source electrode, the portion of the dissolution layer within the third region which is farther away from the drain electrode undergoes more intensive cros slinking reaction, resulting in higher molecular density and hardness of the portion of the dissolution layer within the third region which is farther away from the drain electrode; in the extensive exposure process, the portion of the dissolution layer within the second region and the third region which has a lower molecular density and hardness is more apt to have a molecular chain broken, so that the dissolution layer within the second region which is farther away from the source electrode and the dissolution layer within the third region which is farther away from the drain electrode have fewer molecules with the molecular chain broken; in the developing process, the portion of the dissolution layer within the second region and the third region having fewer molecules with the molecular chain broken is more difficult to dissolve in the developer, so that it is more difficult for the portion of the dissolution layer within the second region which is farther away from the source electrode and the portion of the dissolution layer within the third region which is farther away from the drain electrode to dissolve in the developer.

For example, before the performing the mask exposure on the dissolution layer within the second region and the third region, the method further comprises: prebaking the dissolution layer, to remove a solvent in the dissolution layer.

According to the embodiments of the disclosure, a fabrication method of an array substrate is provided. The method comprises: forming a gate electrode and a gate line, a gate insulating layer, a source electrode and a data line as well as a drain electrode on a base substrate, the source electrode and the drain electrode being located in a same layer, and the gate insulating layer being located between the source electrode as well as the drain electrode and the gate electrode; forming an inverted trapezoidal dissolution layer whose cross section is inverted trapezoidal on the source electrode and the drain electrode, the inverted trapezoidal dissolution layer being soluble in an organic solvent; forming a metal oxide active layer on the source electrode, the drain electrode, the gate insulating layer and the inverted trapezoidal dissolution layer, a thickness of the inverted trapezoidal dissolution layer being greater than a thickness of the metal oxide active layer; dissolving and removing the inverted trapezoidal dissolution layer and the metal oxide active layer thereon with an organic solvent, to form an oxide active layer; forming a passivation layer on the source electrode, the oxide active layer and the drain electrode; forming a pixel electrode on the passivation layer.

For example, the forming the inverted trapezoidal dissolution layer on the source electrode and the drain electrode, includes: forming a dissolution layer on the source electrode and the drain electrode; performing a mask exposure on the dissolution layer within a second region and a third region so that the dissolution layer within the second region and the third region generates an acidic substance, the acidic substance being capable of enhancing a crosslinking reaction, the second region being located on the source electrode, and the third region being located on the drain electrode; performing reverse-drying, extensive exposure and development processes on the dissolution layer, to remove the dissolution layer in other regions except the second region and the third region and to change the dissolution layer within the second region and the third region into the inverted trapezoidal dissolution layer.

According to the embodiments of the disclosure, a display panel is provided. The display panel comprises the array substrate formed by the method as described above.

According to the embodiments of the disclosure, a display device is provided. The display device comprises the display panel as described above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to clarify the objects, technical solutions and advantages of the present disclosure, the embodiments of the present disclosure will be further described in detail in combination with the drawings.

Inventors find that a TFT array substrate of a back channel etching type and a TFT array substrate of a coplanar type at least have problems as follows.

In a patterning process of forming a source electrode and a drain electrode on the TFT array substrate of the back channel etching type, it is necessary to etch away other portions of a source/drain layer except the portion for forming the source electrode and the drain electrode; etching liquid or etching gas is generally used in such etching process, and the etching liquid or the etching gas destroys an oxide active layer, so that a leakage current of the TFT array substrate of the back channel etching type increases, which reduces performance of the TFT array substrate of the back channel etching type.

In a patterning process of forming an oxide active layer on the TFT array substrate of the coplanar type, it is necessary to etch away other portions of a metal oxide layer except the portion for forming the oxide active layer; a wet etching process is generally used in such etching process and acid etching liquid is generally used in the wet etching process, and the acid etching liquid corrodes a metal wiring of a source electrode and a drain electrode, resulting in a longer signal transmission time.

Embodiment One

Figure 1:
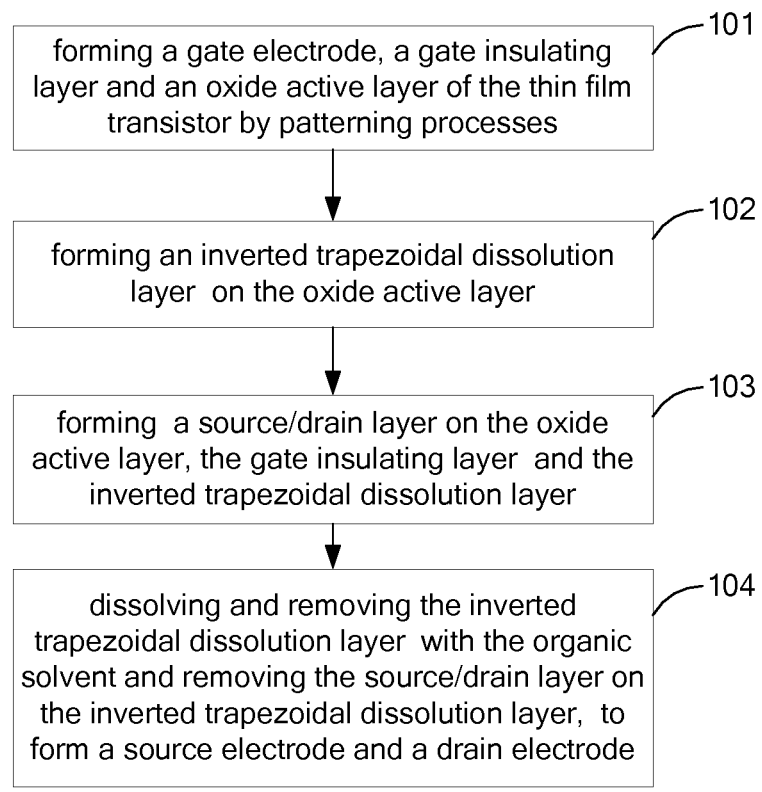
FIG. 1 is a flowchart of a fabrication method of a thin film transistor provided by Embodiment One of the present disclosure.

As shown in FIG. 1, the embodiment of the present disclosure provides a fabrication method of a thin film transistor, and the method comprises the following steps.

Figure 2:
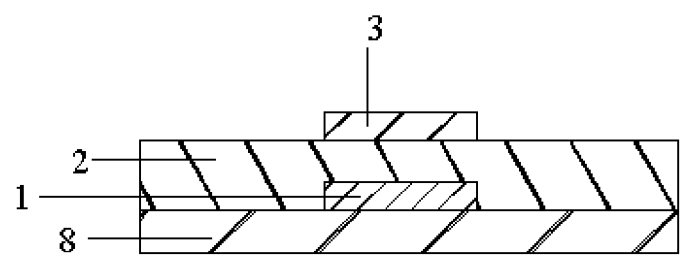
FIG. 2 to FIG. 5 are schematic views of the fabrication method of the thin film transistor provided by Embodiment One of the present disclosure.

Step 101: forming a gate electrode 1, a gate insulating layer 2 and an oxide active layer 3 of the thin film transistor by patterning processes, the gate insulating layer 2 being located between the gate electrode 1 and the oxide active layer 3;

As shown in FIG. 2, the gate electrode 1 is formed by a patterning process, the gate insulating layer 2 is deposited on the gate electrode 1, and the oxide active layer 3 is formed on the gate insulating layer 2 by a patterning process.

Figure 3:
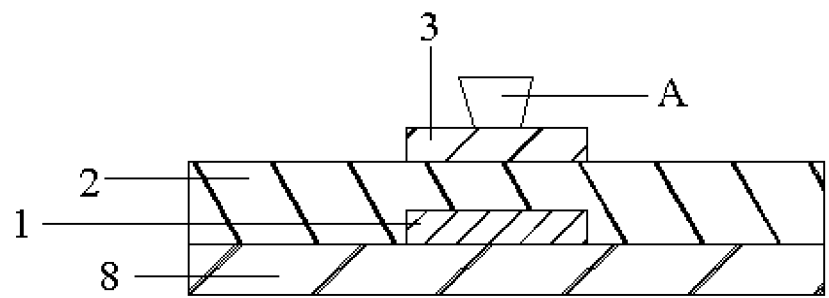

Step 102: forming an inverted trapezoidal dissolution layer A whose cross section is inverted trapezoidal on the oxide active layer 3, the inverted trapezoidal dissolution layer A being soluble in an organic solvent, as shown in FIG. 3;

For example, the organic solvent is acetone or chlorobenzene.

Figure 4:
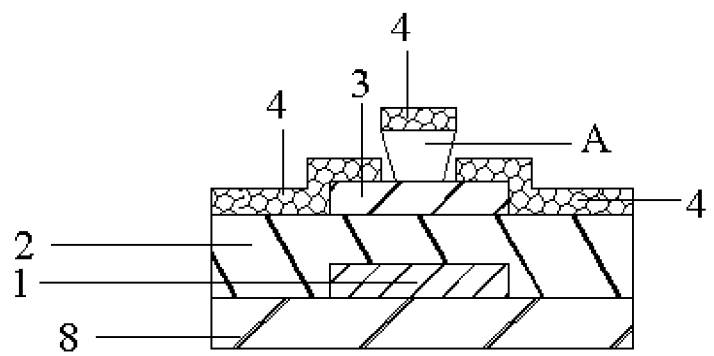

Step 103: depositing a source/drain layer 4 on the oxide active layer 3, the gate insulating layer 2 and the inverted trapezoidal dissolution layer A, a thickness of the inverted trapezoidal dissolution layer A being greater than a thickness of the source/drain layer 4;

As shown in FIG. 4, the thickness of the inverted trapezoidal dissolution layer A is greater than the thickness of the source/drain layer 4, so that the source/drain layer 4 deposited on the inverted trapezoidal dissolution layer A and the source/drain layer 4 deposited on other portions except the inverted trapezoidal dissolution layer A are not in contact with each other.

For example, a difference between the thickness of the inverted trapezoidal dissolution layer A and the thickness of the source/drain layer 4 is greater than or equal to 2 μm.

Step 104: dissolving and removing the inverted trapezoidal dissolution layer A with the organic solvent and removing the source/drain layer 4 on the inverted trapezoidal dissolution layer A, to form a source electrode 5 and a drain electrode 6.

Figure 5:
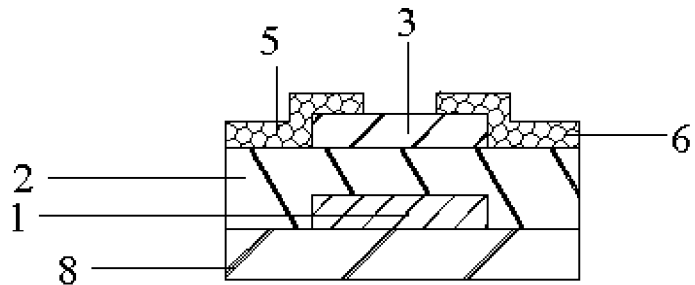

As shown in FIG. 5, the inverted trapezoidal dissolution layer A is dissolved and removed with the organic solvent, the source/drain layer 4 deposited on the inverted trapezoidal dissolution layer A is removed together with the inverted trapezoidal dissolution layer A, and the source/drain layer 4 deposited on other portions except the inverted trapezoidal dissolution layer A is reserved, to form the source electrode 5 and the drain electrode 6.

In the embodiment of the present disclosure, the inverted trapezoidal dissolution layer A is formed on the oxide active layer 3 of the thin film transistor, and other portions of the source/drain layer 4 except the source electrode 5 and the drain electrode 6 are deposited on the inverted trapezoidal dissolution layer A, the thickness of the inverted trapezoidal dissolution layer A is greater than the thickness of the source/drain layer 4, and the inverted trapezoidal dissolution layer A and the source/drain layer 4 thereon are removed with the organic solvent, so as to form the source electrode 5 and the drain electrode 6. In this way, the problem that the dry etching gas or the etching liquid destroys the oxide active layer 3 in the etching process of forming the source electrode 5 and the drain electrode 6 is effectively solved.

Figure 6:
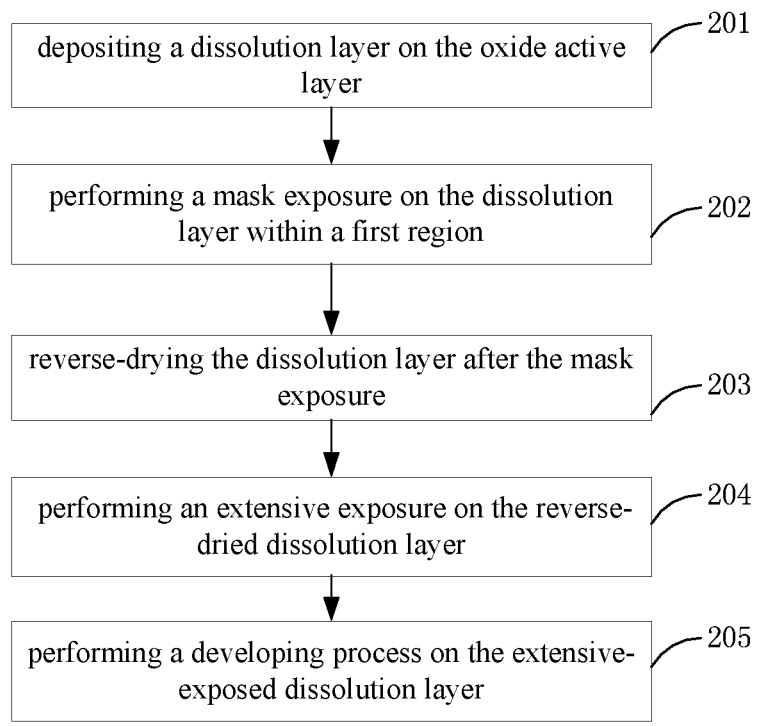
FIG. 6 is a flowchart of a method for forming an inverted trapezoidal dissolution layer provided by Embodiment One of the present disclosure.

Further, as shown in FIG. 6, the embodiment of the present disclosure provides a method for forming the inverted trapezoidal dissolution layer A on the oxide active layer 3, and the method comprises the following steps.

Figure 7:
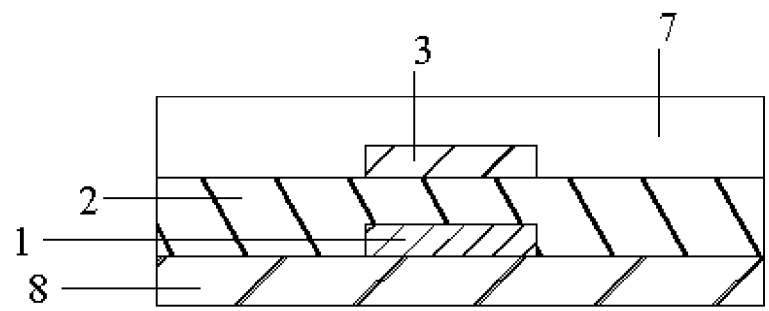
FIG. 7 to FIG. 8 are schematic views of the fabrication method of the inverted trapezoidal dissolution layer provided by Embodiment One of the present disclosure.

Step 201: depositing a dissolution layer 7 on the oxide active layer 3, a thickness of the dissolution layer 7 being greater than the thickness of the source/drain layer 4;

For example, as shown in FIG. 7, the dissolution layer 7 is deposited on the oxide active layer 3, and the dissolution layer 7 is soluble in the organic solvent.

Figure 8:
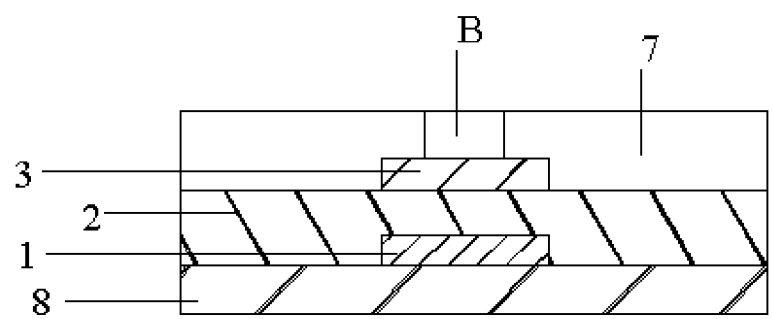

Step 202: performing a mask exposure on the dissolution layer 7 within a first region B, so that the dissolution layer 7 within the first region B generates an acidic substance, the acidic substance being capable of enhancing a crosslinking reaction, the first region B being located on the oxide active layer 3, as shown in FIG. 8;

For example, the process of performing the mask exposure on the dissolution layer 7 within the first region B is: using a mask having a pattern, so that only the dissolution layer 7 within the first region B is exposed but the dissolution layer 7 in other regions except the first region B is not exposed.

As shown in FIG. 8, the first region B is located on the oxide active layer 3, and the dissolution layer 7 within the first region B is subjected to the mask exposure. For example, a photoresist is selected as a material of the dissolution layer 7; in this case, the photoresist in the first region B subjected to the mask exposure produces carboxylic acid, and the carboxylic acid is capable of enhancing the crosslinking reaction. During the mask exposure process, a portion of the photoresist within the first region B which is farther away from the oxide active layer 3 is subjected to stronger intensity of exposure so that the portion of the photoresist within the first region B which is farther away from the oxide active layer 3 generates more carboxylic acid, and thus the photoresist in an upper surface portion of the first region B generates the most carboxylic acid, and the photoresist within the first region B which is in contact with the oxide active layer 3 generates the least carboxylic acid.

For example, a time duration of the mask exposure is greater than or equal to 5 s and less than or equal to 6 s.

For example, a light intensity of the mask exposure is greater than or equal to 30 mJ/cm$^2$ and less than or equal to 60 mJ/cm$^2$.

By controlling the light intensity and the time duration of the mask exposure, the photoresist within the first region B is properly exposed, to generate an appropriate amount of carboxylic acid.

Step 203: reverse-drying the dissolution layer 7.

For example, the thin film transistor is reversed, and the photoresist of the reversed thin film transistor is dried. The photoresist undergoes the crosslinking reaction in the reverse-drying process; under action of carboxylic acid, a degree of the crosslinking reaction of the photoresist within the first region B is stronger than that of the photoresist in other regions; and molecular density and hardness of the photoresist within the first region B are both higher than those of the photoresist in other regions after the reverse-drying process. Since the portion of the photoresist within the first region B which is farther away from the oxide active layer 3 generates more carboxylic acid, the portion of the photoresist within the first region B which is farther away from the oxide active layer 3 undergoes more intensive crosslinking reaction, resulting in higher molecular density and hardness of the portion of the photoresist within the first region B which is farther away from the oxide active layer 3. Therefore, in the first region B, the photoresist in the upper surface portion has the highest molecular density and hardness, and the photoresist which is in contact with the oxide active layer 3 has the lowest molecular density and hardness.

For example, a time duration of the reverse-drying is greater than or equal to 10 mins and less than or equal to 12 mins.

For example, a temperature of the reverse-drying is greater than or equal to 80° C. and less than or equal to 100° C.

By controlling the time duration and the temperature of reverse-drying within a reasonable range, the photoresist undergos the crosslinking reaction sufficiently.

Step 204: performing an extensive exposure on the reverse-dried dissolution layer 7, the dissolution layer 7 in other regions except the first region B having its molecular chain broken during the extensive exposure process.

For example, during the extensive exposure process, the dissolution layer 7 within the first region B and the dissolution layer 7 in other regions except the first region B are both exposed.

In this step, the reverse-dried photoresist is subjected to the extensive exposure; since the degree of the crosslinking reaction of the photoresist within the first region B under the action of carboxylic acid is stronger than that of the photoresist in other regions of the dissolution layer 7 so that molecular density and hardness of the reverse-dried photoresist within the first region B are both higher than those of the photoresist in other regions, the extensive exposure process breaks the molecular chain of the photoresist in other regions except the first region B, and at the same time, breaks the molecular chain of a portion of the photoresist within the first region B which has a lower molecular density and hardness, so that the photoresist within the first region B which is farther away from the oxide active layer 3 has fewer molecules with the molecular chain broken.

For example, a time duration of the extensive exposure is greater than or equal to 5 s and less than or equal to 6 s.

For example, a light intensity of the extensive exposure is greater than or equal to 30 mJ/cm² and less than or equal to 60 mJ/cm².

By controlling the light intensity and the time duration of the extensive exposure within a reasonable range, the photoresist is exposed sufficiently, to prepare for development to form the inverted trapezoidal dissolution layer A in a next step.

Step 205: performing a developing process on the extensive-exposed dissolution layer 7, so that the dissolution layer 7 within the first region B becomes the inverted trapezoidal dissolution layer A and the dissolution layer 7 in other regions is dissolved in a developer.

The extensive-exposed photoresist is subjected to the developing process; since the photoresist in other regions except the first region B has its molecular chain broken during the extensive exposure process, the photoresist in other regions except the first region B is dissolved in the developer. Since the portion of the photoresist within the first region B which is farther away from the oxide active layer 3 has a higher density and hardness, it is more difficult for the portion of the photoresist within the first region B which is farther away from the oxide active layer 3 to be dissolved in the developer, so that the photoresist in the upper surface portion of the first region B is dissolved in the developer the slowest, the photoresist within the first region B which is in contact with the oxide active layer 3 is dissolved in the developer the fastest, and finally the photoresist within the first region B presents an inverted trapezoidal structure, as shown in FIG. 3;

For example, a time duration of the development is greater than or equal to 60 s and less than or equal to 90 s.

By controlling the time duration of the development within a reasonable range, the photoresist in other regions except the first region B is dissolved, and the cross section of the photoresist within the first region B is formed into an inverted trapezoid.

Figure 9:
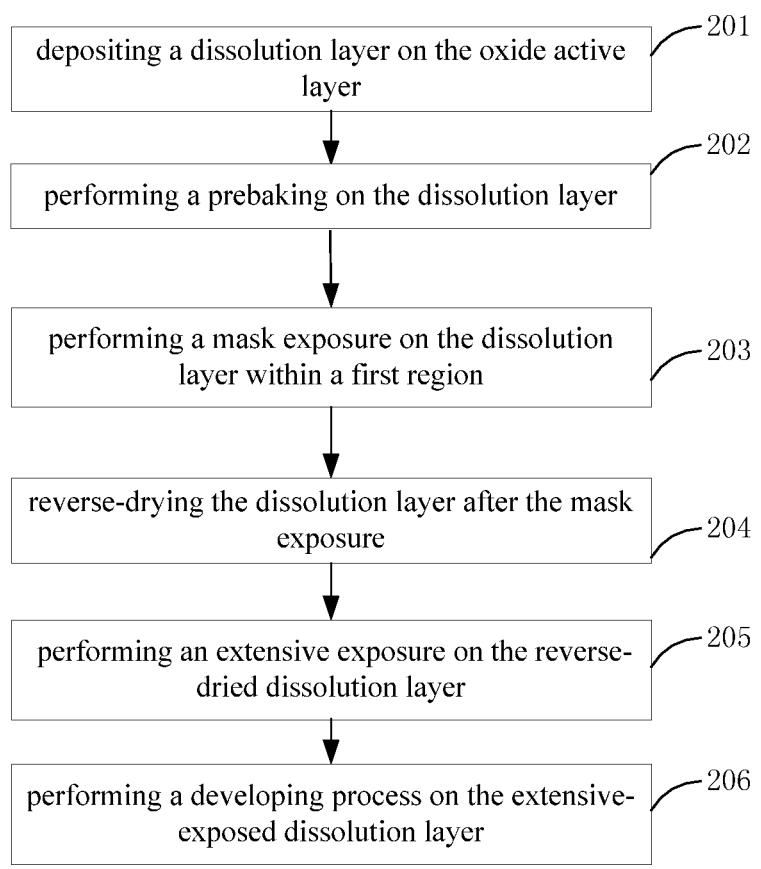
FIG. 9 is a flowchart of the method of forming the inverted trapezoidal dissolution layer provided by Embodiment One of the present disclosure.

For example, as shown in FIG. 9, before the performing the exposure on the dissolution layer 7 within the first region B, the method further comprises:

Prebaking the dissolution layer 7, to remove a solvent in the dissolution layer 7.

In the case that the photoresist is selected as the dissolution layer 7, the prebaking process allows the solvent in the photoresist to be volatilized, so that characteristics of the photoresist are improved, to increase adhesion of the photoresist.

For example, a time duration of the prebaking is greater than or equal to 10 mins and less than or equal to 12 mins.

For example, a temperature of prebaking is greater than or equal to 80° C. and less than or equal to 100° C.

By controlling the time duration and the temperature of the prebaking within a reasonable range, the solvent in the photoresist is volatilized sufficiently.

In the embodiment of the present disclosure, the dissolution layer 7 is deposited on the oxide active layer 3 of the thin film transistor, and the dissolution layer 7 is subjected to the mask exposure process, the reverse-drying process, the extensive exposure process and the development process, so that the dissolution layer 7 forms into the inverted trapezoidal dissolution layer A; other portions of the source/drain layer 4 except the source electrode 5 and the drain electrode 6 are deposited on the inverted trapezoidal dissolution layer A, the thickness of the dissolution layer 7 is greater than the thickness of the source/drain layer 4, and the inverted trapezoidal dissolution layer A and the source/drain layer 4 thereon are removed with the organic solvent, so as to form the source electrode 5 and the drain electrode 6. In this way, the problem that the dry etching gas or the etching liquid destroys the oxide active layer 3 in the etching process of forming the source electrode 5 and the drain electrode 6 is effectively solved.

Figure 10:
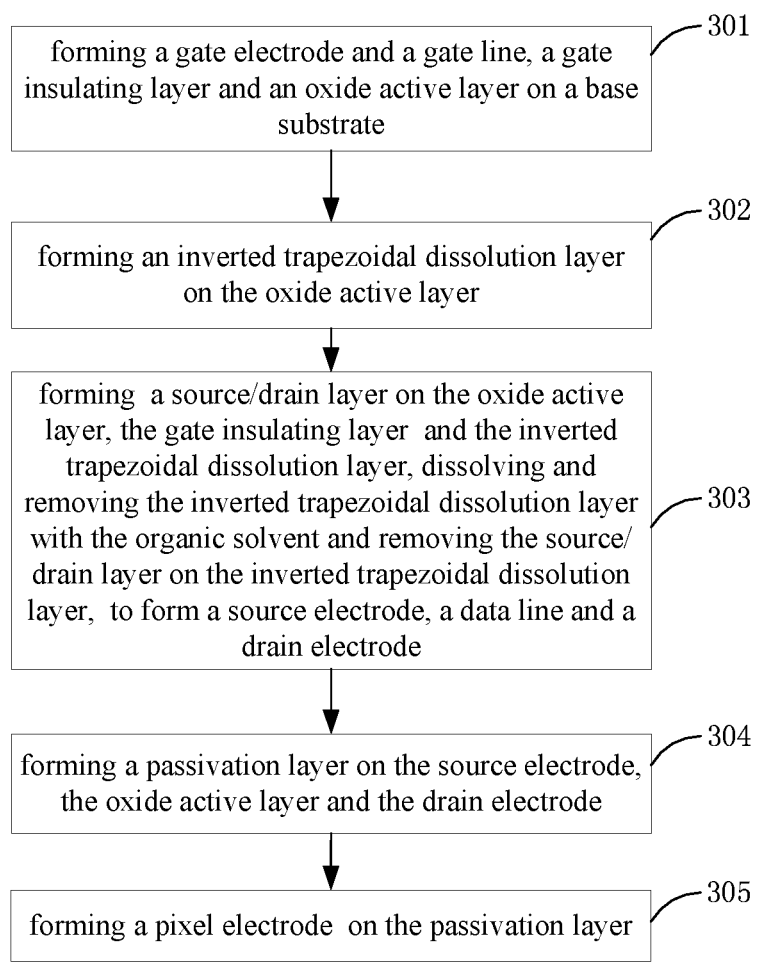
FIG. 10 is a flowchart of a method for fabricating an array substrate provided by Embodiment One of the present disclosure.
Figure 11:
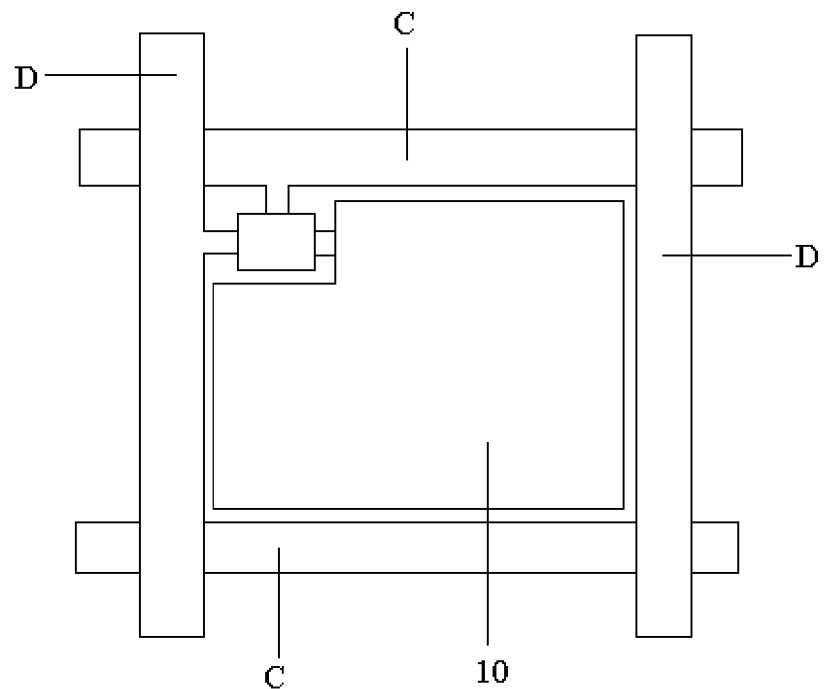
FIG. 11 is a structural schematic view of an array substrate provided by Embodiment One of the present disclosure.

As shown in FIG. 10, the embodiment of the present disclosure provides a fabrication method of an array substrate, comprising:

Step 301: forming a gate electrode 1 and a gate line C, a gate insulating layer 2 and an oxide active layer 3 on a base substrate 8, the gate insulating layer 2 being located between the gate electrode 1 and the oxide active layer 3, as shown in FIG. 11 and with reference to FIG. 2;

For example, as shown in FIG. 11 and with reference to FIG. 2, a gate electrode layer is deposited on the base substrate 8, the gate electrode 1 and the gate line C are formed by a single patterning process, the gate insulating layer 2 is deposited on the gate electrode 1, the oxide active layer 3 is formed on the gate insulating layer 2 by a single patterning process, and the gate insulating layer 2 is located between the gate electrode 1 and the oxide active layer 3.

Step 302: forming an inverted trapezoidal dissolution layer A on the oxide active layer 3, the inverted trapezoidal dissolution layer A being soluble in an organic solvent;

For example, as shown in FIG. 7, firstly, the dissolution layer 7 is deposited on the oxide active layer 3; thereafter, as shown in FIG. 8, a mask exposure is performed on the dissolution layer 7 in a first region B of the dissolution layer 7, so that the dissolution layer 7 in the first region B generates an acidic substance, the acidic substance is capable of enhancing a crosslinking reaction, and the first region B is located on the oxide active layer 3.

Thereafter, a reverse-drying, an extensive exposure and a development processes are performed on the dissolution layer 7, to remove the dissolution layer 7 in other regions except the first region B and to change the dissolution layer 7 within the first region B into an inverted trapezoidal dissolution layer A, as shown in FIG. 3.

Step 303: depositing a source/drain layer 4 on the oxide active layer 3, the gate insulating layer 2 and the inverted trapezoidal dissolution layer A, a thickness of the inverted trapezoidal dissolution layer A being greater than a thickness of the source/drain layer 4, dissolving and removing the inverted trapezoidal dissolution layer A and the source/drain layer 4 thereon, to form a source electrode 5 and a data line D as well as a drain electrode 6;

As shown in FIG. 4, the source/drain layer 4 is deposited, other source/drain layers 4 except the source electrode 5 and the drain electrode 6 are deposited on the inverted trapezoidal dissolution layer A; and as shown in FIG. 5 and with reference to FIG. 11, the inverted trapezoidal dissolution layer A and the source/drain layer 4 thereon are removed with the organic solvent, to form the source electrode 5 and the data line D as well as the drain electrode 6;

For example, a difference between the thickness of the inverted trapezoidal dissolution layer A and the thickness of the source/drain layer 4 is greater than or equal to 2

Figure 12:
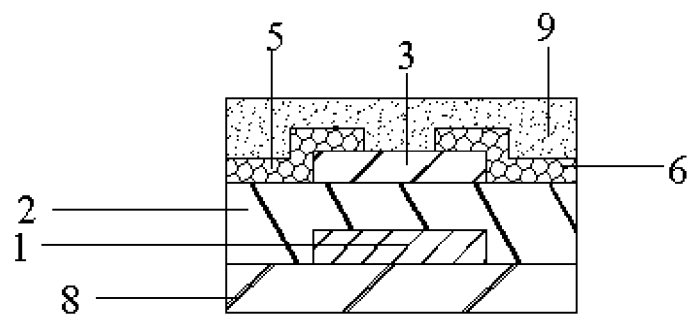
FIG. 12 to FIG. 13 are schematic views of a fabrication method of an array substrate provided by Embodiment One of the present disclosure.

Step 304: forming a passivation layer 9 on the source electrode 5, the oxide active layer 3 and the drain electrode 6;

As shown in FIG. 12, the passivation layer 9 is formed on the source electrode 5, the oxide active layer 3 and the drain electrode 6;

Step 305: forming a pixel electrode 10 on the passivation layer 9.

Figure 13:
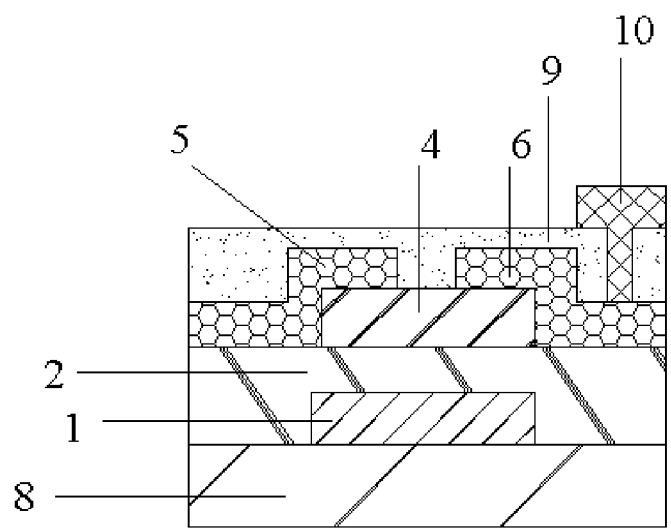

As shown in FIG. 13, a pixel electrode layer is deposited on the passivation layer 9, and the pixel electrode 10 is formed by a single patterning process.

Figure 14:
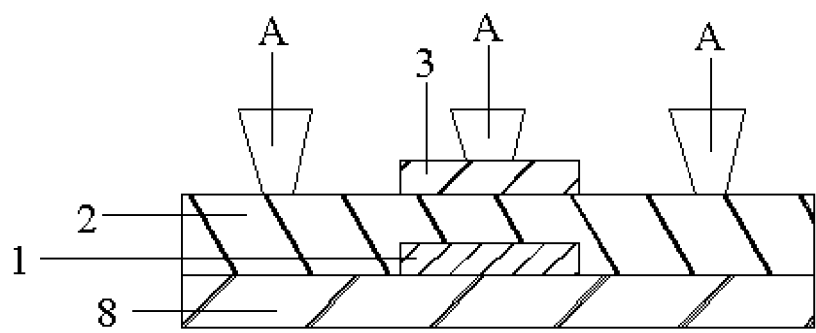
FIG. 14 to FIG. 18 are schematic views of the fabrication method of the array substrate in the case that several inverted trapezoidal dissolution layers are formed provided by Embodiment One of the present disclosure.
Figure 15:
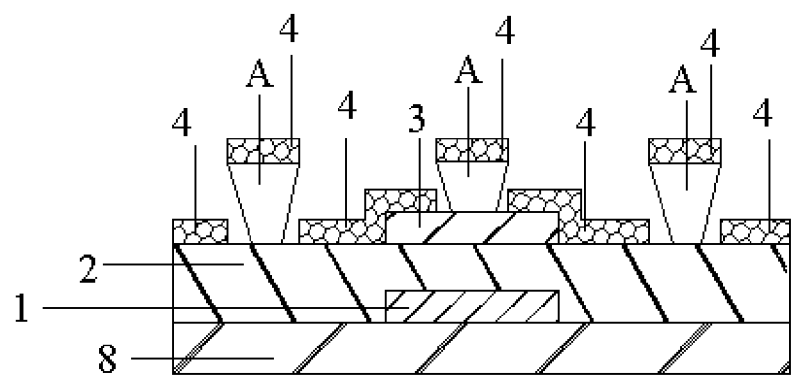
Figure 16:
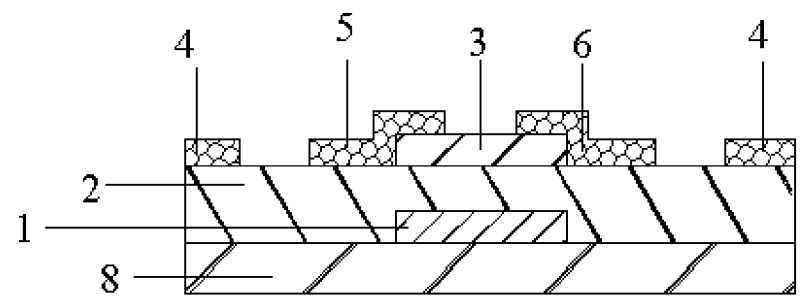
Figure 17:
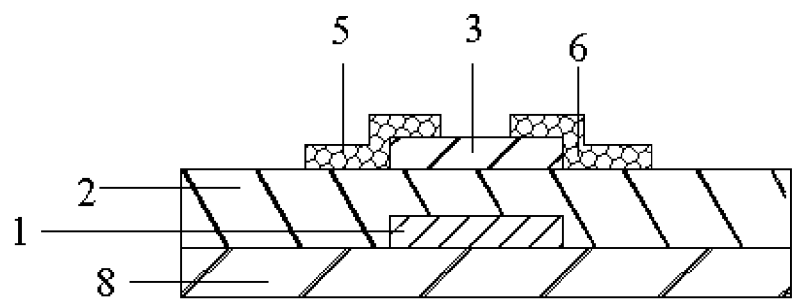
Figure 18:
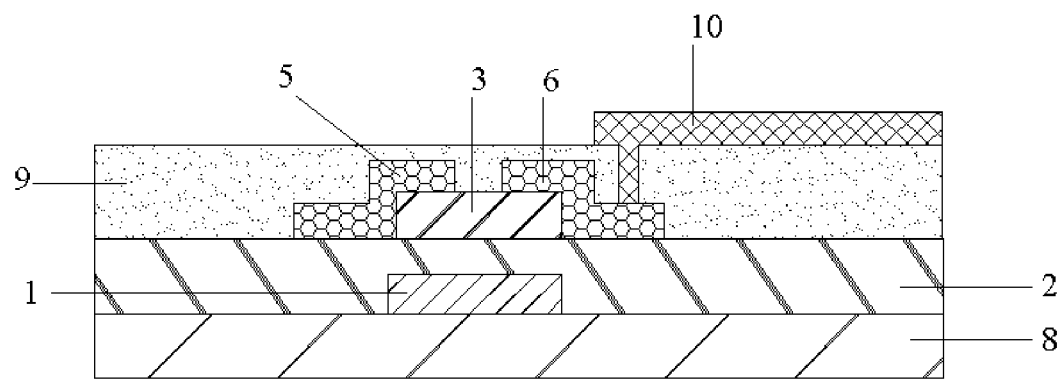

For example, as shown in FIG. 14, in the process of forming the inverted trapezoidal dissolution layer A, the dissolution layer 7 is formed into a plurality of inverted trapezoidal dissolution layer A;

As shown in FIG. 15, the source/drain layer 4 is deposited on the oxide active layer 3, the gate insulating layer 2 and the inverted trapezoidal dissolution layers A;

As shown in FIG. 16, the inverted trapezoidal dissolution layers A and the source/drain layer 4 thereon are removed with the organic solvent, to form the source electrode 5 and the drain electrode 6. Then, a redundant source/drain layer 4 is removed, as shown in FIG. 17;

As shown in FIG. 18, the passivation layer 9 is deposited, and the pixel electrode layer is deposited on the passivation layer to form the pixel electrode 10. The pixel electrode according to the embodiment of the present disclosure may be any one of a liquid crystal pixel electrode, a common electrode, and an anode or a cathode in an OLED display substrate, which will not be limited hereto.

In the embodiment of the present disclosure, the dissolution layer 7 is deposited on the oxide active layer 3 of the array substrate, the dissolution layer 7 is subjected to the mask exposure process, the reverse-drying process, the extensive exposure process and the development process, so that the dissolution layer 7 forms into the inverted trapezoidal dissolution layer A; other portions of the source/drain layer 4 except the source electrode 5 and the drain electrode 6 are deposited on the inverted trapezoidal dissolution layer A, the thickness of the dissolution layer 7 is greater than the thickness of the source/drain layer 4, and the inverted trapezoidal dissolution layer A and the source/drain layer 4 thereon are removed with the organic solvent, so as to form the source electrode 5 and the drain electrode 6. In this way, the problem that the dry etching gas or the etching liquid destroys the oxide active layer 3 in the etching process of forming the source electrode 5 and the drain electrode 6 is effectively solved.

The embodiment of the present disclosure provides a display panel, the display panel comprising the array substrate formed by using the method as described above.

The embodiment of the present disclosure provides a display device, the display device comprising the display panel as described above.

Embodiment Two

Figure 19:
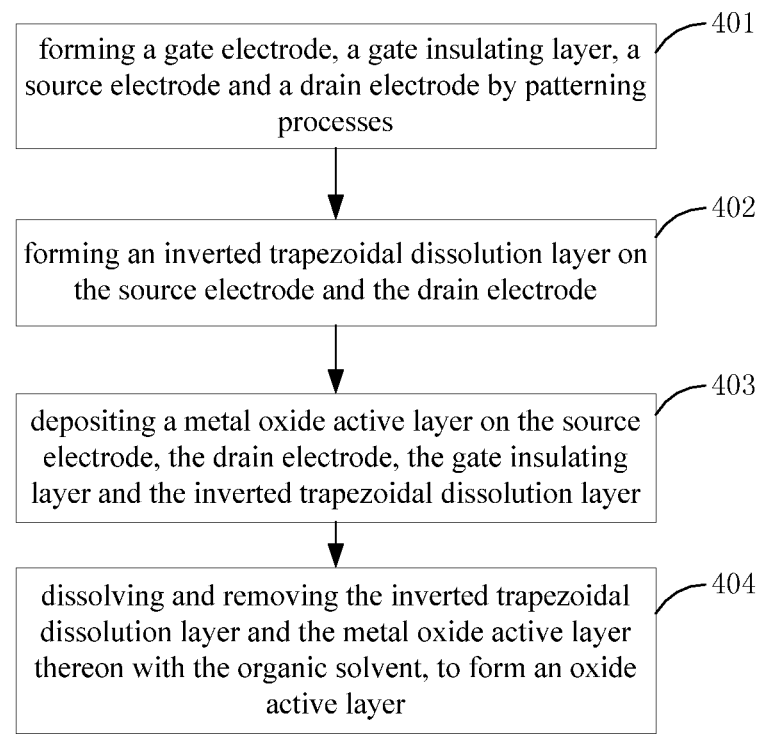
FIG. 19 is a flowchart of a method for fabricating a thin film transistor provided by Embodiment Two of the present disclosure.

As shown in FIG. 19, the embodiment of the present disclosure provides a fabrication method of a thin film transistor, and the method comprises the following steps.

Figure 20:
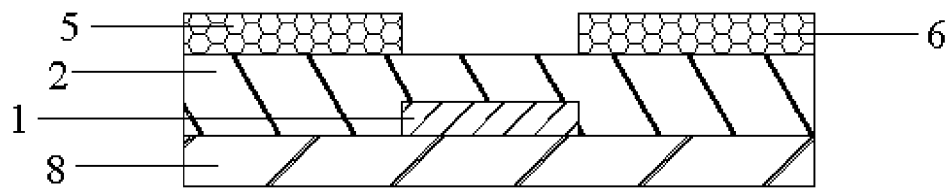
FIG. 20 to FIG. 23 are schematic views of the fabrication method of the thin film transistor provided by Embodiment Two of the present disclosure.

Step 401: forming a gate electrode 1, a gate insulating layer 2, a source electrode 5 and a drain electrode 6 of the thin film transistor by patterning processes, the source electrode 5 and the drain electrode 6 being located in a same layer, and the gate insulating layer 2 being located between the source electrode 5 as well as the drain electrode 6 and the gate electrode 1;

As shown in FIG. 20, the gate electrode 1 is formed by a patterning process, the gate insulating layer 2 is deposited on the gate electrode 1; and the source electrode 5 and the drain electrode 6 are formed on the gate insulating layer 2 by a patterning process.

Figure 21:
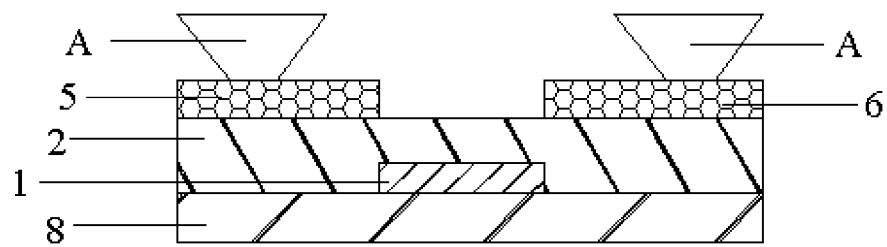

Step 402: forming an inverted trapezoidal dissolution layer A on the source electrode 5 and the drain electrode 6, the inverted trapezoidal dissolution layer A being soluble in an organic solvent, as shown in FIG. 21;

For example, the organic solvent is acetone or chlorobenzene.

Figure 22:
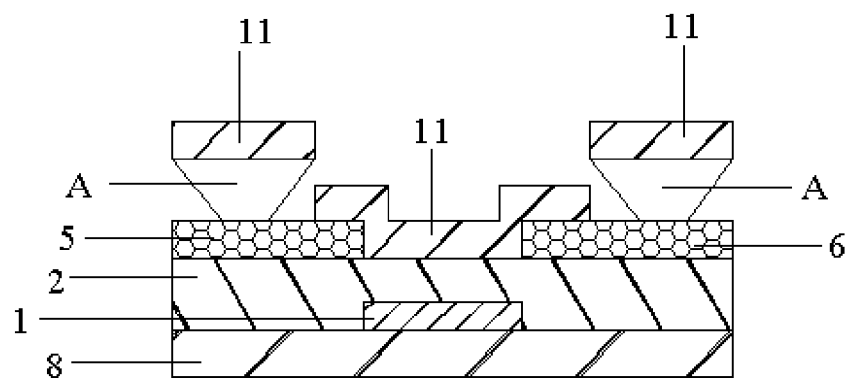

Step 403: depositing a metal oxide active layer 11 on the source electrode 5, the drain electrode 6, the gate insulating layer 2 and the inverted trapezoidal dissolution layer A, a thickness of the inverted trapezoidal dissolution layer A being greater than a thickness of the metal oxide active layer 11;

As shown in FIG. 22, the thickness of the inverted trapezoidal dissolution layer A is greater than the thickness of the metal oxide active layer 11, so that the metal oxide active layer 11 deposited on the inverted trapezoidal dissolution layer A and the metal oxide active layer 11 deposited on other portions except the inverted trapezoidal dissolution layer A are not in contact with each other.

For example, a difference between the thickness of the inverted trapezoidal dissolution layer A and the thickness of the metal oxide active layer 11 is greater than or equal to 2 µm.

Step 404: dissolving and removing the inverted trapezoidal dissolution layer A and the metal oxide active layer 11 thereon with the organic solvent, to form an oxide active layer 3.

Figure 23:
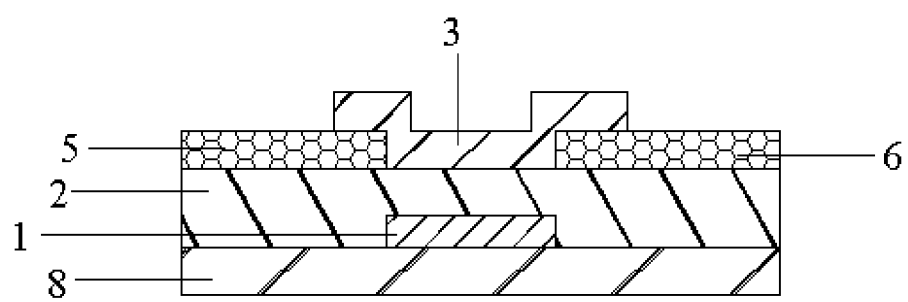

As shown in FIG. 22, the inverted trapezoidal dissolution layer A is dissolved and removed with the organic solvent, and the metal oxide active layer 11 deposited on the inverted trapezoidal dissolution layer A is removed together with the inverted trapezoidal dissolution layer A, to form the oxide active layer 3, as shown in FIG. 23.

In the embodiment of the present disclosure, the inverted trapezoidal dissolution layer A is formed on the source electrode 5 and the drain electrode 6 of the thin film transistor, other portions of the metal oxide active layer 11 except the oxide active layer 3 are deposited on the inverted trapezoidal dissolution layer A, and the thickness of the inverted trapezoidal dissolution layer A is greater than the thickness of the metal oxide active layer 11; and the inverted trapezoidal dissolution layer A and the metal oxide active layer 11 thereon are removed with the organic solvent, so as to form the oxide active layer 3. In this way, the problem that the acid etching liquid corrodes the metal wiring of the source electrode 5 and the drain electrode 6 in the case that the oxide active layer 3 is formed by using the wet etching process is effectively solved.

Figure 24:
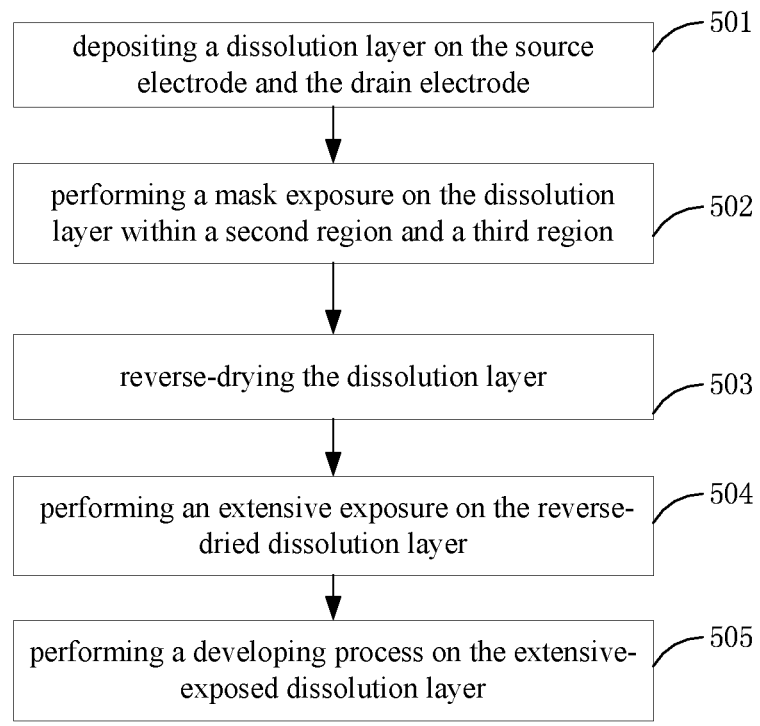
FIG. 24 is a flowchart of a method for forming an inverted trapezoidal dissolution layer provided by Embodiment Two of the present disclosure.

As shown in FIG. 24, the embodiment of the present disclosure provides a method for forming the inverted trapezoidal dissolution layer A on the source electrode 5 and the drain electrode 6, and the method comprises the following steps.

Figure 25:
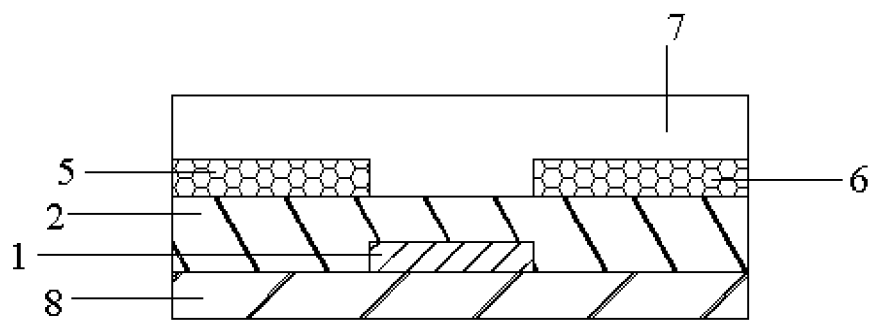
FIG. 25 to FIG. 26 are schematic views of the fabrication method of the inverted trapezoidal dissolution layer provided by Embodiment Two of the present disclosure.

Step 501: depositing a dissolution layer 7 on the source electrode 5 and the drain electrode 6, a thickness of the dissolution layer 7 being greater than the thickness of a metal oxide active layer 11;

For example, as shown in FIG. 25, a dissolution layer 7 is deposited on the source electrode 5 and the drain electrode 6, and the dissolution layer 7 is soluble in the organic solvent.

Figure 26:
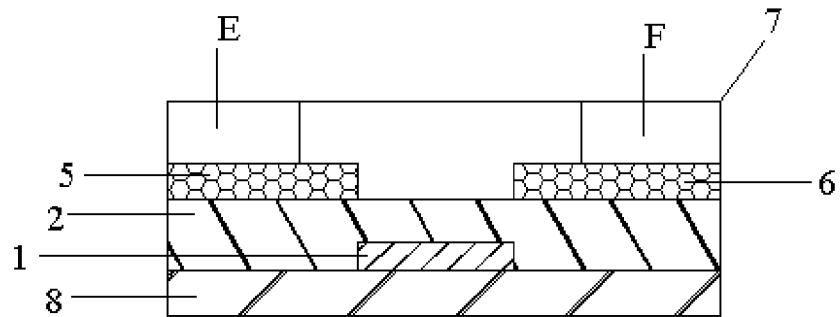

Step 502: performing a mask exposure on the dissolution layer 7 within a second region E and a third region F, so that the dissolution layer 7 within the second region E and the third region F generates an acidic substance, the acidic substance being capable of enhancing a crosslinking reaction, the second region E being located on the source electrode 5, and the third region F being located on the drain electrode 6, as shown in FIG. 26;

For example, the process of performing the mask exposure on the dissolution layer 7 within the second region E and the third region F is: using a mask, only the dissolution layer 7 within the second region E and the third region F is exposed, but the dissolution layer 7 except the second region E and the third region F is not exposed.

As shown in FIG. 26, the second region E is located on the source electrode 5, the third region F is located on the drain electrode 6, and the dissolution layer 7 within the second region E and the third region F is subjected to the mask exposure. For example, a photoresist is selected as a material of the dissolution layer 7, and in this case, after the photoresist within the second region E and the third region F is subjected to the mask exposure, the photoresist within the second region E and the third region F produces carboxylic acid, and the carboxylic acid is capable of enhancing the crosslinking reaction. During the mask exposure process, a portion of the photoresist within the second region E which is farther away from the source electrode 5 is subjected to stronger intensity of exposure, so that the portion of the photoresist within the second region E which is farther away from the source electrode 5 generates more carboxylic acid; and thus, the photoresist in an upper surface portion of the second region E generates the most carboxylic acid, and the photoresist within the second region E which is in contact with the source electrode 5 generates the least carboxylic acid. In addition, a portion of the photoresist within the third region F which is farther away from the drain electrode 6 is subjected to stronger intensity of exposure, so that the portion of the photoresist within the third region F which is farther away from the drain electrode 6 generates more carboxylic acid; and thus, the photoresist in an upper surface portion of the third region F generates the most carboxylic acid, and photoresist within the third region F which is in contact with the drain electrode 6 generates the least carboxylic acid.

For example, a time duration of the mask exposure is greater than or equal to 5 s and less than or equal to 6 s.

For example, a light intensity of the mask exposure is greater than or equal to 30 mJ/cm$^2$ and less than or equal to 60 mJ/cm$^2$.

By controlling the light intensity and the time duration of the mask exposure, the photoresist within the second region E and the third region F is properly exposed, to generate an appropriate amount of carboxylic acid.

Step 503: reverse-drying the dissolution layer 7.

For example, the thin film transistor is reversed, and the photoresist of the reversed thin film transistor is dried. The photoresist undergoes the crosslinking reaction in the reverse-drying process; under action of carboxylic acid, a degree of the crosslinking reaction of the photoresist within the second region E and the third region F is stronger than that of photoresist in other regions; and after the reverse-drying process, molecular density and hardness of the photoresist within the second region E and the third region F are both higher than those of the photoresist in other regions. Since the portion of the photoresist within the second region E which is farther away from the source electrode 5 generates more carboxylic acid and the portion of the photoresist within the third region F which is farther away from the drain electrode 6 generates more carboxylic acid, the portion of the photoresist within the second region E which is farther away from the source electrode 5 and the portion of the photoresist within the third region F which is farther away from the drain electrode 6 undergo more intensive crosslinking reaction, resulting in higher molecular density and hardness of the portion of the photoresist within the second region E which is farther away from the source electrode 5 and the portion of the photoresist within the third region F which is farther away from the drain electrode 6. In the second region E, the photoresist in the upper surface portion has the highest molecular density and hardness, and the photoresist which is in contact with the source electrode 5 has the lowest molecular density and hardness. In the third region F, the photoresist in the upper surface portion has the highest molecular density and hardness, and the photoresist which is in contact with the drain electrode 6 has the lowest molecular density and hardness.

For example, a time duration of the reverse-drying is greater than or equal to 10 mins and less than or equal to 12 mins.

For example, a temperature of the reverse-drying is greater than or equal to 80° C. and less than or equal to 100° C.

By controlling the time duration and the temperature of the reverse-drying within a reasonable range, the photoresist undergoes the crosslinking reaction sufficiently.

Step 504: performing an extensive exposure on the reverse-dried dissolution layer 7, so that the dissolution layer 7 in other regions except the second region E and the third region F has its molecular chain broken during the extensive exposure process;

For example, during the extensive exposure process, the dissolution layer 7 within the second region E and the third region F and the dissolution layer 7 in other regions except the second region E and the third region F are both exposed.

The reverse-dried photoresist is subjected to the extensive exposure; since the degree of the crosslinking reaction of the photoresist within the second region E and the third region F under the action of carboxylic acid is stronger than that of photoresist in other regions so that molecular density and hardness of the reverse-dried photoresist within the second region E and the third region F are both higher than those of the photoresist in other regions, the extensive exposure process breaks the molecular chain of the photoresist in other regions except the second region E and the third region F, and at the same time, breaks the molecular chain of a portion of the photoresist within the second region E and the third region F which has a lower molecular density and hardness, so that the photoresist within the second region E which is farther away from the source electrode 5 and the photoresist within the third region F which is farther away from the drain electrode 6 have fewer molecules with the molecular chain broken.

For example, a time duration of extensive exposure is greater than or equal to 5 s and less than or equal to 6 s.

For example, a light intensity of extensive exposure is greater than or equal to 30 mJ/cm$^2$ and less than or equal to 60 mJ/cm$^2$.

By controlling the light intensity and the time duration of the extensive exposure within a reasonable range, the photoresist is exposed sufficiently, to prepare for development to form the inverted trapezoidal dissolution layer A in a next step.

Step 505: performing a developing process on the extensive-exposed dissolution layer 7, so that the dissolution layer 7 within the second region E and the third region F becomes the inverted trapezoidal dissolution layer A and the dissolution layer 7 in other regions is dissolved in a developer.

The developing process is performed on the extensive-exposed photoresist; since the photoresist in other regions except the second region E and the third region F has its molecular chain broken during the extensive exposure process, the photoresist in other regions except the second region E and the third region F is dissolved in the developer; since the portion of the photoresist within the second region E which is farther away from the source electrode 5 and the portion of the photoresist within the third region F which is farther away from the drain electrode 6 have higher density and hardness, it is more difficult for the portion of the photoresist within the second region E which is farther away from the source electrode 5 and the portion of the photoresist within the third region F which is farther away from the drain electrode 6 to be dissolved in the developer, so that the photoresist in the upper surface portion of the second region E is dissolved in the developer the slowest, the photoresist within the second region E which is in contact with the source electrode 5 is dissolved in the developer the fastest, the photoresist in the upper surface portion of the third region F is dissolved in the developer the slowest, the photoresist within the third region F which is in contact with the drain electrode 6 is dissolved in the developer the fastest, and finally the photoresist within the second region E and the third region F presents an inverted trapezoidal structure, as shown in FIG. 21;

For example, a time duration of development is greater than or equal to 60 s and less than or equal to 90 s.

By controlling the time duration of the development within a reasonable range, the photoresist in other regions except the second region E and the third region F is dissolved, and a cross section of the photoresist within the second region E and the third region F is formed into an inverted trapezoid.

Figure 27:
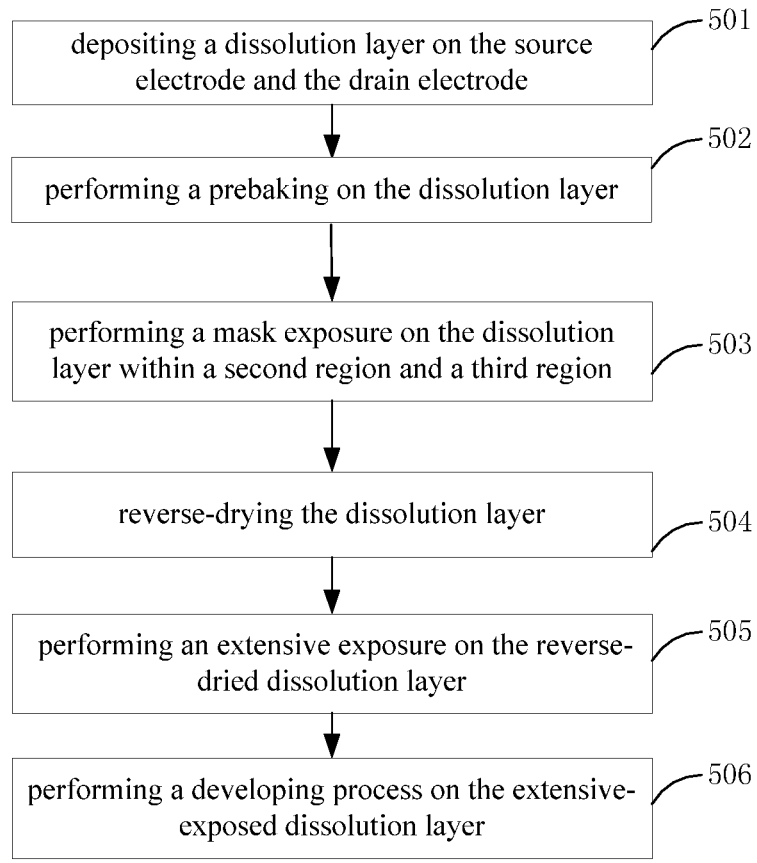
FIG. 27 is a flowchart of the method for forming the inverted trapezoidal dissolution layer provided by Embodiment Two of the present disclosure.

For example, as shown in FIG. 27, before the performing the mask exposure on the dissolution layer 7 within the second region E and a third region F, the method further comprises: prebaking the dissolution layer 7, to remove a solvent in the dissolution layer 7.

For example, the photoresist is selected as the dissolution layer 7, and in this case, the prebaking process allows the solvent in the photoresist to be volatilized, so that characteristics of the photoresist are improved, to increase adhesion of the photoresist.

For example, a time duration of prebaking is greater than or equal to 10 mins and less than or equal to 12 mins.

For example, a temperature of prebaking is greater than or equal to 80° C. and less than or equal to 100° C.

By controlling the time duration and the temperature of the prebaking within a reasonable range, the solvent in the photoresist is volatilized sufficiently.

In the embodiment of the present disclosure, the dissolution layer 7 is deposited on the source electrode 5 and the drain electrode 6 of the thin film transistor, the dissolution layer 7 is subjected to the mask exposure process, the reverse-drying process, the extensive exposure process and the development process, so that the dissolution layer 7 forms into the inverted trapezoidal dissolution layer A, other portions of the metal oxide active layer 11 except the oxide active layer 3 are deposited on the inverted trapezoidal dissolution layer A, the thickness of the dissolution layer 7 is greater than the thickness of the metal oxide active layer 11, and the inverted trapezoidal dissolution layer A and the metal oxide active layer 11 thereon are removed with the organic solvent, so as to form the oxide active layer 3. In this way, the problem that the acid etching liquid corrodes the metal wiring of the source electrode 5 and the drain electrode 6 in the case that the oxide active layer 3 is formed by using the wet etching process is effectively solved.

Figure 28:
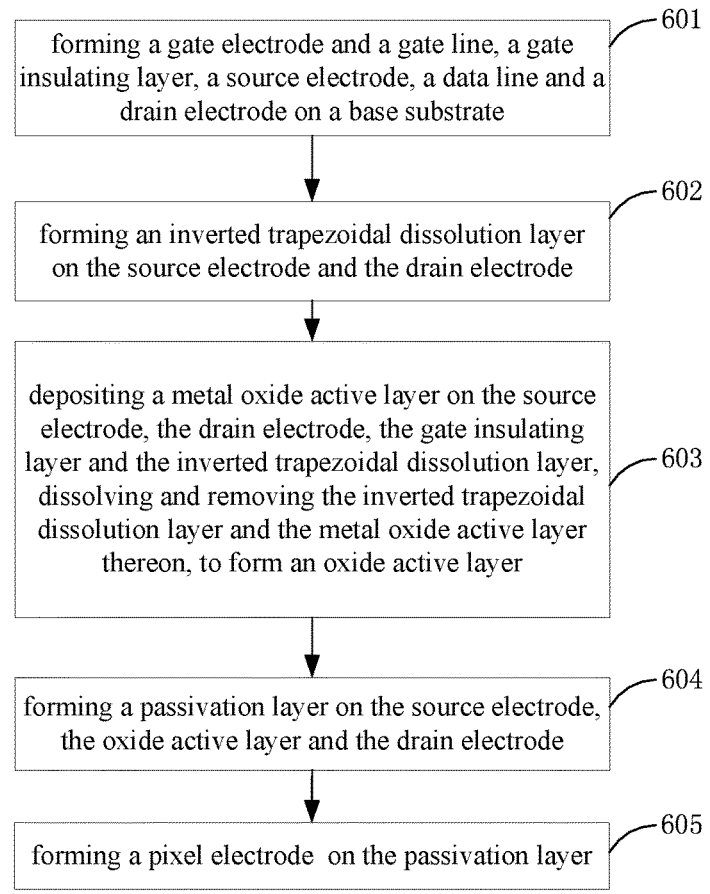
FIG. 28 is a flowchart of a method for fabricating an array substrate provided by Embodiment Two of the present disclosure.

As shown in FIG. 28, the embodiment of the present disclosure provides a fabrication method of an array substrate, and the method comprises the following steps.

Step 601: forming a gate electrode 1 and a gate line C, a gate insulating layer 2, a source electrode 5 and a data line D as well as a drain electrode 6 on a base substrate 8, the source electrode 5 and the data line D as well as the drain electrode 6 being located in a same layer, and the gate insulating layer 2 being located between the source electrode 5, the drain electrode 6 and the gate electrode 1, as shown in FIG. 11 and with reference to FIG. 20;

For example, as shown in FIG. 11 and with reference to FIG. 20, a gate electrode layer is deposited on the base substrate 8, the gate electrode 1 and the gate line C are formed by a single patterning process, the gate insulating layer 2 is deposited on the gate electrode 1, the source electrode 5 and the data line D as well as the drain electrode 6 are formed on the gate insulating layer 2 by a single patterning process, and the gate insulating layer 2 is located between the source electrode 5, the drain electrode 6 and the gate electrode 1.

Step 602: forming an inverted trapezoidal dissolution layer A on the source electrode 5 and the drain electrode 6, the inverted trapezoidal dissolution layer A being soluble in an organic solvent;

For example, as shown in FIG. 25, firstly, the dissolution layer 7 is deposited on the source electrode 5 and the drain electrode 6. Thereafter, as shown in FIG. 26, a mask exposure is performed on the dissolution layer 7 within a second region E and a third region F of the dissolution layer 7, so that the dissolution layer 7 within the second region E and the third region F generates an acidic substance, the acidic substance is capable of enhancing a crosslinking reaction, and the second region E is located on the source electrode 5 and the third region F is located on the drain electrode 6.

Thereafter, a reverse-drying process, an extensive exposure process and a development process are performed on the dissolution layer 7, to remove the dissolution layer 7 in other regions except the second region E and the third region F and to change the dissolution layer 7 within the second region E and the third region F into the inverted trapezoidal dissolution layer A, as shown in FIG. 21.

Step 603: depositing a metal oxide active layer 11 on the source electrode 5, the drain electrode 6, the gate insulating layer 2 and the inverted trapezoidal dissolution layer A, a thickness of the inverted trapezoidal dissolution layer A being greater than a thickness of the metal oxide active layer 11, dissolving and removing the inverted trapezoidal dissolution layer A and the metal oxide active layer 11 thereon, to form an oxide active layer 3;

As shown in FIG. 22, the metal oxide active layer 11 is deposited, and other metal oxide active layer 11 except the oxide active layer 3 are deposited on the inverted trapezoidal dissolution layer A; the inverted trapezoidal dissolution layer A and the metal oxide active layer 11 thereon are removed with the organic solvent, to form the oxide active layer 3, as shown in FIG. 23;

For example, a difference between the thickness of the inverted trapezoidal dissolution layer A and the thickness of the metal oxide active layer 11 is greater than or equal to 2 µm.

Figure 29:
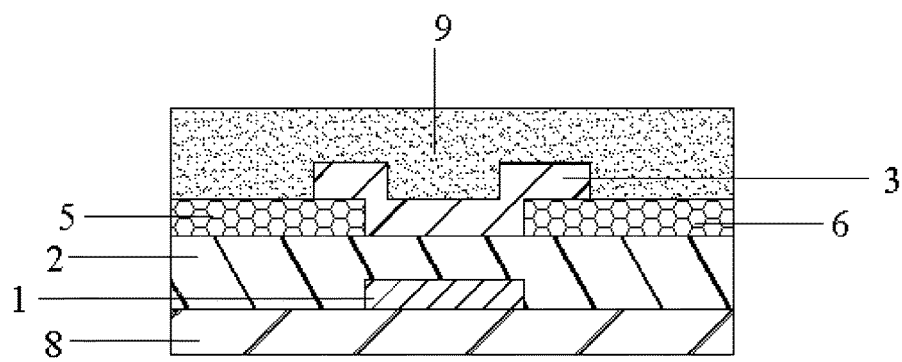
FIG. 29 to FIG. 30 are schematic views of the fabrication method of the array substrate provided by Embodiment Two of the present disclosure.

Step 604: forming a passivation layer 9 on the source electrode 5, the oxide active layer 3 and the drain electrode 6;

As shown in FIG. 29, the passivation layer 9 is formed on the source electrode 5, the oxide active layer 3 and the drain electrode 6;

Step 605: forming a pixel electrode 10 on the passivation layer 9.

Figure 30:
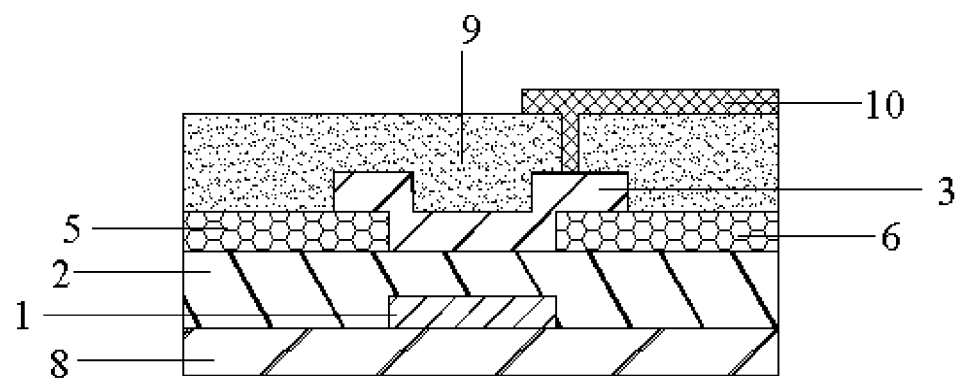

As shown in FIG. 30, a pixel electrode layer is deposited on the passivation layer 9, and the pixel electrode 10 is formed by a single patterning process. The pixel electrode according to the embodiment of the present disclosure may be one of a liquid crystal pixel electrode, a common electrode, and an anode or a cathode in an OLED display substrate, which will not be limited here.

In the embodiment of the present disclosure, the dissolution layer 7 is deposited on the source electrode 5 and the drain electrode 6 of the array substrate, the dissolution layer 7 is subjected to the mask exposure process, the reverse-drying process, the extensive exposure process and the development process so that the dissolution layer 7 forms the inverted trapezoidal dissolution layer A, other portions of the metal oxide active layer 11 except the oxide active layer 3 are deposited on the inverted trapezoidal dissolution layer A, the thickness of the dissolution layer 7 is greater than the thickness of the metal oxide active layer 11, and the inverted trapezoidal dissolution layer A and the metal oxide active layer 11 thereon are removed with the organic solvent, so as to form the oxide active layer 3. In this way, the problem that acid etching liquid corrodes a metal wiring of the source electrode 5 and the drain electrode 6 in the case that the oxide active layer 3 is formed by using the wet etching process is effectively solved.

The embodiment of the present disclosure provides a display panel, the display panel comprising the array substrate formed by using the method as described above.

The embodiment of the present disclosure provides a display device, the display device comprising the display panel as described above.

The foregoing embodiments merely are exemplary embodiments of the present disclosure, and not intended to define the scope of the present disclosure, and the scope of the present disclosure is determined by the appended claims.

The present application claims priority of Chinese Patent Application No. 201510718317.3 filed on Oct. 29, 2015, the present disclosure of which is incorporated herein by reference in its entirety as part of the present application.

The invention claimed is:

1. A fabrication method of a thin film transistor, comprising:
    forming a gate electrode, a gate insulating layer and an oxide active layer of the thin film transistor by patterning processes, the gate insulating layer being located between the gate electrode and the oxide active layer;
    forming an inverted trapezoidal dissolution layer whose cross section is inverted trapezoidal on the oxide active layer, the inverted trapezoidal dissolution layer being soluble in an organic solvent, and the inverted trapezoidal dissolution layer only covering a first portion, which is directly opposite the gate electrode, of the oxide active layer but portions of the oxide active layer other than the first portion of the oxide active layer are not covered by anything;
    forming a source/drain layer on the oxide active layer, the gate insulating layer and the inverted trapezoidal dissolution layer, a thickness of the inverted trapezoidal dissolution layer being greater than a thickness of the source/drain layer; and
    dissolving and removing the inverted trapezoidal dissolution layer with the organic solvent and removing the source/drain layer on the inverted trapezoidal dissolution layer, to form a source electrode and a drain electrode.

2. The fabrication method of the thin film transistor according to claim 1, wherein, the source/drain layer formed on the inverted trapezoidal dissolution layer is disconnected from the source/drain layer formed on other portions except the inverted trapezoidal dissolution layer.

3. The fabrication method of the thin film transistor according to claim 1, wherein, the forming the inverted trapezoidal dissolution layer on the oxide active layer, includes:
    forming a dissolution layer on the oxide active layer;
    performing a mask exposure on the dissolution layer within a first region so that the dissolution layer within the first region generates an acidic substance, the acidic substance being capable of enhancing a crosslinking reaction, and the first region being located on the oxide active layer;
    performing reverse-drying, extensive exposure and development processes on the dissolution layer, so as to remove the dissolution layer in other regions except the first region and to change the dissolution layer within the first region into the inverted trapezoidal dissolution layer.

4. The fabrication method of the thin film transistor according to claim 3, wherein, during the mask exposure process, a portion of the dissolution layer within the first region which is farther away from the oxide active layer is subjected to stronger intensity of exposure, so that the portion of the dissolution layer within the first region which is farther away from the oxide active layer generates more acidic substance.

5. The fabrication method of the thin film transistor according to claim 3, wherein, the performing reverse-drying, extensive exposure and development processes on the dissolution layer, so as to remove the dissolution layer in other regions except the first region and to change the dissolution layer within the first region into the inverted trapezoidal dissolution layer, includes:
   performing the reverse-drying on the thin film transistor, the dissolution layer undergoing the crosslinking reaction in the reverse-drying process, a degree of the crosslinking reaction of the dissolution layer within the first region under action of the acidic substance being stronger than that of the dissolution layer in other regions, and molecular density and hardness of dissolution layer within the first region being both higher than those of the dissolution layer in other regions after the reverse-drying process;
   performing the extensive exposure on the reverse-dried thin film transistor, the dissolution layer in other regions having its molecular chain broken during the extensive exposure process;
   performing the development process on the extensive-exposed dissolution layer, so that the dissolution layer within the first region becomes the inverted trapezoidal dissolution layer and the dissolution layer in other regions is dissolved in a developer.

6. The fabrication method of the thin film transistor according to claim 5, wherein,
   in the reverse-drying process, and under action of the acidic substance in the dissolution layer within the first region, the portion of the dissolution layer within the first region which is farther away from the oxide active layer undergoes more intensive crosslinking reaction, resulting in higher molecular density and hardness of the portion of the dissolution layer within the first region which is farther away from the oxide active layer;
   in the extensive exposure process, the portion of the dissolution layer within the first region which has a lower molecular density and hardness is more apt to have a molecular chain broken, so that the portion of the dissolution layer within the first region which is farther away from the oxide active layer has fewer molecules with the molecular chain broken;
   in the development process, the portion of the dissolution layer within the first region having fewer molecules with the molecular chain broken is more difficult to dissolve in the developer, so that it is more difficult for the portion of the dissolution layer within the first region which is farther away from the oxide active layer to dissolve in the developer.

7. The fabrication method of the thin film transistor according to claim 3, wherein, before the performing the mask exposure on the dissolution layer within the first region, the method further comprises:
   prebaking the dissolution layer, to remove a solvent in the dissolution layer.

8. A fabrication method of an array substrate, comprising:
   forming a gate electrode and a gate line, a gate insulating layer and an oxide active layer on a base substrate, the gate insulating layer being located between the gate electrode and the oxide active layer;
   forming an inverted trapezoidal dissolution layer whose cross section is inverted trapezoidal on the oxide active layer, the inverted trapezoidal dissolution layer being soluble in an organic solvent, and the inverted trapezoidal dissolution layer only covering a first portion, which is directly opposite the gate electrode, of the oxide active layer but portions of the oxide active layer other than the first portion of the oxide active layer are not covered by anything;
   forming a source/drain layer on the oxide active layer, the gate insulating layer and the inverted trapezoidal dissolution layer, a thickness of the inverted trapezoidal dissolution layer being greater than a thickness of the source/drain layer;
   dissolving and removing the inverted trapezoidal dissolution layer with the organic solvent and removing the source/drain layer on the inverted trapezoidal dissolution layer, to form a source electrode, a data line and a drain electrode;
   forming a passivation layer on the source electrode, the oxide active layer and the drain electrode; and
   forming a pixel electrode on the passivation layer.

9. The fabrication method of the array substrate according to claim 8, wherein, the forming the
   a mask exposure on the dissolution layer within a first region, so that the dissolution layer within the first region generates an acidic substance, the acidic substance being capable of enhancing a crosslinking reaction, and the first region being located on the oxide active layer;
   performing reverse-drying, extensive exposure and development processes on the dissolution layer, so as to remove the dissolution layer in other regions except the first region and to change the dissolution layer within the first region into the inverted trapezoidal dissolution layer.

10. A display panel, comprising the array substrate formed by the method according to claim 8.

11. A display device, comprising the display panel according to claim 10.

12. The fabrication method of the thin film transistor according to claim 1, further comprising:
   forming an another inverted trapezoidal dissolution layer and a still another inverted trapezoidal dissolution layer during forming the inverted trapezoidal dissolution layer, the another inverted trapezoidal dissolution layer and the still another inverted trapezoidal dissolution layer are respectively on two opposite sides of the inverted trapezoidal dissolution layer, the another inverted trapezoidal dissolution layer and the still another inverted trapezoidal dissolution layer are spaced apart from the oxide active layer so that the oxide active layer is not covered by the another inverted trapezoidal dissolution layer and the still another inverted trapezoidal dissolution layer;
   forming the source/drain layer on the oxide active layer, the gate insulating layer, the inverted trapezoidal dissolution layer, the another inverted trapezoidal dissolution layer and the still another inverted trapezoidal dissolution layer;

dissolving and removing the inverted trapezoidal dissolution layer, the another inverted trapezoidal dissolution layer and the still another inverted trapezoidal dissolution layer with the organic solvent and removing the source/drain layer on the inverted trapezoidal dissolution layer, the another inverted trapezoidal dissolution layer and the still another inverted trapezoidal dissolution layer, to form the source electrode and the drain electrode; and removing a remaining portion, disconnected from the source electrode and the drain electrode, of the source/drain layer.

13. The fabrication method of the thin film transistor according to claim 1, wherein a difference between the thickness of the inverted trapezoidal dissolution layer and the thickness of the source/drain layer is greater than or equal to 2 μm.

* * * * *